United States Patent
Loo et al.

(10) Patent No.: US 12,336,239 B2
(45) Date of Patent: Jun. 17, 2025

(54) TENSILE STRAINED SEMICONDUCTOR MONOCRYSTALLINE NANOSTRUCTURE

(71) Applicant: IMEC VZW, Leuven (BE)

(72) Inventors: Roger Loo, Leuven (BE); Geert Eneman, Heverlee (BE); Clement Porret, Kessel-lo (BE)

(73) Assignee: IMEC VZW, Leuven (BE)

( * ) Notice: Subject to any disclaimer, the term of this patent is extended or adjusted under 35 U.S.C. 154(b) by 153 days.

(21) Appl. No.: 17/240,694

(22) Filed: Apr. 26, 2021

(65) Prior Publication Data

US 2021/0336002 A1    Oct. 28, 2021

(30) Foreign Application Priority Data

Apr. 27, 2020   (EP) .................................... 20171624

(51) Int. Cl.
*H01L 29/06*    (2006.01)
*H01L 29/167*   (2006.01)
(Continued)

(52) U.S. Cl.
CPC .......... *H10D 62/121* (2025.01); *H10D 30/797* (2025.01); *H10D 62/834* (2025.01)

(58) Field of Classification Search
CPC ....... H01L 21/02603; H01L 21/823431; H01L 21/823821; H01L 21/845; H01L 27/0886; H01L 27/0924; H01L 27/1211; H01L 29/0665; H01L 29/0669; H01L 29/0673; H01L 29/167; H01L 29/41791;
(Continued)

(56) References Cited

U.S. PATENT DOCUMENTS 7,341,787 B2    3/2008    Krautbauer et al.
7,795,122 B2    9/2010    Bu et al.
(Continued)

FOREIGN PATENT DOCUMENTS

CN    104711675 A    6/2015

OTHER PUBLICATIONS

Jeon, Jihee, Akihiro Suzuki, Kouta Takahashi, Osamu Nakatsuka, and Shigeaki Zaima. "Development of in-situ Sb-Doped Ge 1-x Sn x Epitaxial Layers for Source/Drain Stressor of Strained Ge Transistors." In 2017 IEEE Electron Devices Technology and Manufacturing Conference (EDTM), pp. 249-251. IEEE.
(Continued)

*Primary Examiner* — David C Spalla
(74) *Attorney, Agent, or Firm* — McDonnell Boehnen Hulbert & Berghoff LLP

(57) ABSTRACT

A semiconductor structure including a semiconductor substrate having a top surface, one or more group IV semiconductor monocrystalline nanostructures, each having a first and a second extremity defining an axis parallel to the top surface of the semiconductor substrate and separated therefrom by a non-zero distance, each nanostructure having a source structure epitaxially grown on the first extremity and a drain structure epitaxially grown on the second extremity. The epitaxial source and drain structures are made of a group IV semiconductor doped with one or more of Sb and Bi, and optionally one or more of As and P, thereby creating tensile strain in the group IV semiconductor monocrystalline nanostructure.

18 Claims, 1 Drawing Sheet

(51) Int. Cl.
*H01L 29/78* (2006.01)
*H10D 30/69* (2025.01)
*H10D 62/10* (2025.01)
*H10D 62/834* (2025.01)

(58) Field of Classification Search
CPC ......... H01L 29/66439; H01L 29/66795; H01L 29/775; H01L 29/785; H01L 29/7851; H01L 29/7853; H01L 29/7855; H01L 29/78618; H01L 29/7848; H01L 2029/7858; H10D 30/014; H10D 30/024; H10D 30/62; H10D 30/6211; H10D 30/9219; H10D 30/6713; H10D 30/6735; H10D 30/797; H10D 62/021; H10D 62/118; H10D 62/119; H10D 62/121; H10D 62/149; H10D 62/151; H10D 84/013; H10D 84/017; H10D 84/0158; H10D 84/834; H10D 84/853
See application file for complete search history.

(56) References Cited

U.S. PATENT DOCUMENTS

| | | |
|---|---|---|
| 9,577,038 B1 | 2/2017 | Doris |
| 10,541,136 B2 | 1/2020 | Mazur et al. |
| 2018/0047832 A1* | 2/2018 | Tapily ............... H01L 29/66545 |
| 2020/0020774 A1* | 1/2020 | Lee .................... H01L 29/7848 |
| 2020/0091287 A1* | 3/2020 | Glass ................. H01L 29/1079 |
| 2021/0066455 A1* | 3/2021 | Lee .................... H01L 29/0886 |
| 2021/0328012 A1* | 10/2021 | Tsai .................. H01L 21/02535 |
| 2022/0199797 A1 | 6/2022 | Naskar |
| 2022/0336654 A1* | 10/2022 | Vellianitis ....... H01L 21/823807 |

OTHER PUBLICATIONS

Tahini, H. A., Alexander Chroneos, R. W. Grimes, and Udo Schwingenschlögl. "Co-doping with antimony to control phosphorous diffusion in germanium." Journal of Applied Physics 113, No. 7 (2013): 073704.

Bennett, Nick S., A. J. Smith, R. M. Gwilliam, R. P. Webb, B. J. Sealy, Nick EB Cowern, L. O'Reilly, and P. J. McNally. "Antimony for n-type metal oxide semiconductor ultrashallow junctions in strained Si: A superior dopant to arsenic?." Journal of Vacuum Science & Technology B: Microelectronics and Nanometer Structures Processing, Measurement, and Phenomena 26, No. 1 (2008): 391-395.

Oehme, M., J. Werner, and E. Kasper. "Molecular beam epitaxy of highly antimony doped germanium on silicon." Journal of Crystal Growth 310, No. 21 (2008): 4531-4534.

Capogreco, E., L. Witters, H. Arimura, F. Sebaai, C. Porret, A. Hikavyy, R. Loo et al. "First demonstration of vertically stacked gate-all-around highly strained germanium nanowire pFETs." IEEE Transactions on Electron Devices 65, No. 11 (2018): 5145-5150.

* cited by examiner

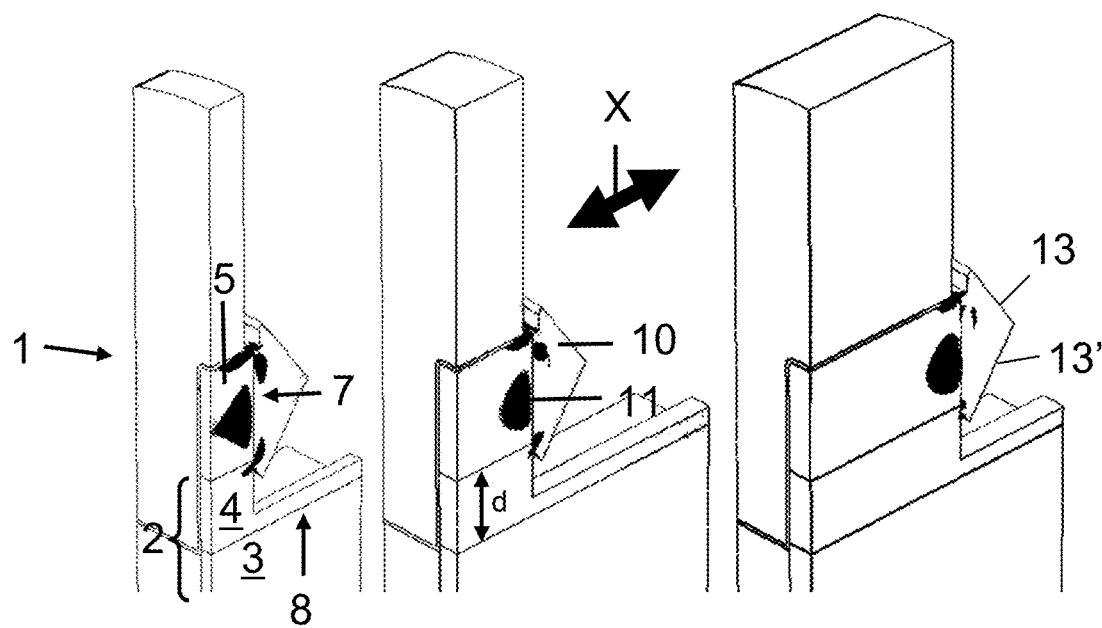

TENSILE STRAINED SEMICONDUCTOR MONOCRYSTALLINE NANOSTRUCTURE

CROSS-REFERENCE TO RELATED APPLICATIONS

The present application is a non-provisional patent application claiming priority to European Provisional Patent Application No. 20171624.8, filed Apr. 27, 2020, the contents of which are hereby incorporated by reference.

FIELD OF THE DISCLOSURE

The present disclosure relates to semiconductor structures and more in particular to semiconductor monocrystalline nanostructures such as nanowires, nanosheets, as well as to methods for producing the same.

BACKGROUND

To compete with the best performances of fin field-effect transistors (FinFETs) and planar FETs, charge mobility in semiconductor monocrystalline nanostructures such as nanowires and nanosheets, as used in complementary field-effect transistors (CFETs), must be enhanced. One way to enhance the mobility is by introducing strain of an adequate type in the nanostructure.

E. Capogreco et al. (IEEE transactions on electron devices, vol. 65, No. 11, November 2018, 5145-5150) disclosed 45 nm fin pitch compressively strained p-type Ge gate-all-around devices fabricated on SiGe strain-relaxed-buffers on 300 mm wafers. The uniaxial strain obtained along the Ge wire originates from the lattice mismatch between the Ge source/drain and the SiGe strain-relaxed-buffer on which they are grown. Such devices, however, rely on the bottom-up growth of source and drain structures from the substrate. Such a growth process is however not preferred for emerging semiconductor monocrystalline nanostructures, including CFETs. Instead, epitaxially growing the source and the drain directly from the extremities of the channel is desirable in such devices as it allows the use of different source/drain materials with different doping types for different superimposed nanostructures. It is however not yet clear if strain, let alone an adequate type of strain, can be introduced by source/drain material epitaxially grown from these extremities.

SUMMARY

The present disclosure provides semiconductor structures having charge mobility or methods for obtaining the same.

The above is accomplished by a method, a semiconductor structure, and uses according to the present disclosure.

In a first aspect, the present disclosure refers to a semiconductor structure comprising:
  A semiconductor substrate having a top surface,
  One or more group IV semiconductor monocrystalline nanostructures, each having a first and a second extremity defining an axis parallel to the top surface of the semiconductor substrate and separated therefrom by a non-zero distance, each nanostructure having a source structure epitaxially grown on the first extremity and a drain structure epitaxially grown on the second extremity,
  wherein the epitaxial source and drain structures are made of a group IV semiconductor doped with one or more of Sb and Bi, and optionally one or more of As and P, thereby creating tensile strain in the group IV semiconductor monocrystalline nanostructure.

In a second aspect, the present disclosure relates to a method for forming a semiconductor structure according to any embodiment of the first aspect, comprising:
  a. Providing a semiconductor substrate having a top surface,
  b. Providing one or more semiconductor monocrystalline nanostructures, each having a first and a second extremity defining an axis parallel to the top surface of the semiconductor substrate and separated therefrom by a non-zero distance,
  c. Growing epitaxially on each semiconductor monocrystalline nanostructures a source structure on the first extremity, and a drain structure on the second extremity,
  wherein the epitaxial source and drain structures are made of a group IV semiconductor doped with one or more of Sb and Bi, and optionally one or more of As and P, thereby creating tensile strain in the group IV semiconductor monocrystalline nanostructure.

In a third aspect, the present disclosure relates to the use of epitaxially grown source and drain structures made of a first group IV semiconductor material doped with one or more of Sb and Bi, and optionally one or more of As and P, to induce tensile strain in a semiconductor monocrystalline nanostructure made of a second group IV semiconductor monocrystalline material which can be the same or which can be different from the first group IV semiconductor material.

In some example embodiments of the present disclosure, tensile strain can be induced in semiconductor monocrystalline nanostructures forming n-type transistors.

In some example embodiments of the present disclosure, tensile strain can be introduced by growing a source and a drain structure from the side extremities of nanostructures, thereby making the structure compatible with CFET technology.

Some example embodiments of the present disclosure make use of materials already in use in semiconductor technology and necessitating little adaptation to current manufacturing practices.

Some example embodiments of the present disclosure have potential to boost charge mobility and to improve performance in FETs using (lateral) semiconductor monocrystalline nanostructure as channels.

Some example embodiments of the present disclosure adopt a particular doping of the source and the drain, one can make the semiconductor monocrystalline nanostructure on which the source and the drain are grown tensile strained.

Particular aspects of the disclosure are set out in the accompanying independent and dependent claims. Features from the dependent claims may be combined with features of the independent claims and with features of other dependent claims as appropriate and not merely as explicitly set out in the claims.

The above and other characteristics and features of the present disclosure will become apparent from the following detailed description, taken in conjunction with the accompanying drawings, which illustrate, by way of example, the principles of the disclosure. This description is given for the sake of example only, without limiting the scope of the disclosure. The reference FIGURE quoted below refer to the attached drawings.

BRIEF DESCRIPTION OF THE FIGURES

The above, as well as additional, features will be better understood through the following illustrative and non-limiting detailed description of example embodiments, with reference to the appended drawings.

FIG. 1 is a schematic representation of a perspective view of an embodiment of the first aspect of the present disclosure.

All the FIGURES are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under, and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. The word "comprising" according to the disclosure therefore also includes as one embodiment that no further components are present. Thus, the scope of the expression "a device comprising means A and B" should not be interpreted as being limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of example embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosure.

In the description provided herein, numerous specific details are set forth. However, it is understood that embodiments of the disclosure may be practiced without these specific details. In other instances, well-known methods, structures, and techniques have not been shown in detail in order not to obscure an understanding of this description.

The following terms are provided solely to aid in the understanding of the disclosure.

As used herein and unless provided otherwise, the term "nanostructure" refers to a structure having at least one of its three dimensions (length, width, or height) which measures from 1 to 100 nm.

As used herein, the length (l), width (w) and height (h) of a three-dimensional object, such as a nanostructure, are respectively the longest of both horizontal dimensions (i.e. parallel to a main surface (i.e. the top surface) of the substrate), the shortest of both horizontal dimensions, and the vertical dimension (i.e. perpendicular to a main surface (i.e. the top surface) of the substrate).

As used herein and unless provided otherwise, the term "nanowire" refers to a structure having its two smallest dimensions measuring from 1 to 100 nm, having the ratio of its larger dimension to the second larger dimension greater than two, and having a ratio between its second largest dimension and its shortest dimension from 1 to 2, more typically from 1 to 1.5.

As used herein and unless provided otherwise, the term "nanosheet" refers to a structure having its smallest dimension measuring from 1 to 100 nm, and having the ratio of its second largest dimension to its third largest dimension greater than 2.

A nanostructure is typically present in one of two orientations being lateral and vertical. A lateral nanostructure has a lateral orientation towards the substrate or substrate surface (i.e. its longest dimension (here, its length) is parallel thereto). It may also be referred to as a horizontal nanostructure. A vertical nanostructure has its orientation perpendicular or vertical towards that substrate or substrate surface (i.e. its longest dimension (here, its height) is perpendicular thereto).

The nanostructures referred to herein can be lateral (or horizontal) nanostructures. Each nanostructure typically functions as a channel in a field-effect transistor.

As used herein, a strained structure is a structure which is deformed under the action of an applied mechanical force, called stress. In absence of this force, at equilibrium, the structure will be in its relaxed (i.e. unstrained) state. In the context of the present disclosure, the strained structure will typically be a strained monocrystalline structure adopting (strained) lattice constants differing from its unstrained (i.e. relaxed) lattice constants (cf. infra). The deformation of the lattice is the result of a stress component applied to the material, leading to a (e.g. compressive or tensile) strain. Such an external stress occurs when the material is for example epitaxially grown on a monocrystalline surface which has a lattice constant which is different from the corresponding unstrained (i.e. relaxed) lattice constant of the material making up the layer.

As used herein, a distinction is made between unstrained lattice constants (i.e. the relaxed lattice constants of the material in absence of stress), and actual lattice constants of a monocrystalline material or surface (i.e. the lattice constants of the monocrystalline material or surface as it is present in the structure of interest) and which may be equal to or different from its unstrained lattice constants.

The disclosure will now be described by a detailed description of several embodiments of the disclosure. It is clear that other embodiments of the disclosure can be configured according to the knowledge of persons skilled in the art without departing from the technical teaching of the disclosure, the disclosure being limited only by the terms of the appended claims.

Reference will be made to transistors. These are three-terminal devices having a first main electrode such as a drain, a second main electrode such as a source and a control electrode such as a gate for controlling the flow of electrical charges between the first and second main electrodes.

The disclosure addresses concepts that, surprisingly and contrary to what is observed in traditional source/drain stressors using phosphorous doping, epitaxially growing a phosphorous-doped source structure on the first extremity and a phosphorous-doped drain structure on the second extremity of a nanostructure such as a nanowire or a nanosheet leads to a compressive longitudinal channel strain where a tensile strain was expected. The present disclosure proposes that when the source/drain structures are made of a group IV semiconductor doped with one or more of Sb and Bi, and optionally one or more of As and P, a tensile strain can be obtained instead.

In a first aspect, the present disclosure refers to a semiconductor structure comprising:

A semiconductor substrate having a top surface,

One or more group IV semiconductor monocrystalline nanostructures, each having a first and a second extremity defining an axis parallel to the top surface of the semiconductor substrate and separated therefrom by a non-zero distance, each nanostructure having a source structure epitaxially grown on the first extremity and a drain structure epitaxially grown on the second extremity, wherein the source and drain structures are made of a group IV semiconductor doped with one or more of Sb and Bi, and optionally one or more of As and P, thereby creating tensile strain in the group IV semiconductor monocrystalline nanostructure.

In other words, in the first aspect, the present disclosure relates to a semiconductor structure comprising:

A semiconductor substrate having a top surface,

One or more group IV semiconductor monocrystalline nanostructures, each having a first and a second extremity defining an axis parallel to the top surface of the semiconductor substrate and separated therefrom by a non-zero distance, each nanostructure having a source structure on the first extremity and a drain structure on the second extremity, wherein a surface of the source structure in contact with a surface of the first extremity has a crystal lattice structure matching the crystal lattice structure of the surface of the first extremity, wherein a surface of the drain structure in contact with a surface of the second extremity has a crystal lattice structure matching the crystal lattice structure of the surface of the second extremity, wherein the source and drain structures are made of a group IV semiconductor doped with one or more of Sb and Bi, and optionally one or more of As and P, thereby creating tensile strain in the group IV semiconductor monocrystalline nanostructure.

Both formulations of the first aspect are herein considered equivalent because a first structure epitaxially grown on a second structure is a monocrystalline structure wherein a surface thereof in contact with a surface of the second structure has a crystal lattice structure matching the crystal lattice structure of the surface of the second structure.

Also, instead of describing the first and the second extremity as defining an axis parallel to the top surface of the semiconductor substrate and separated therefrom by a non-zero distance, it is equivalent to describe the first and the second extremity as being separated by the length of the semiconductor monocrystalline nanostructure, the length being parallel to the top surface of the semiconductor substrate and separated therefrom by a non-zero distance.

In embodiments, the semiconductor structure of the first aspect may comprise a plurality of group IV semiconductor monocrystalline nanostructures stacked above one another. For instance, the semiconductor structure may comprise an n-type group IV semiconductor monocrystalline nanostructure stacked above a p-type group IV semiconductor monocrystalline nanostructure, or vice versa. In embodiments, the semiconductor structure of the first aspect may be a CFET. For instance, the CFET may comprise an n-type (or p-type) group IV semiconductor monocrystalline nanowire situated above a p-type (or n-type) group IV semiconductor monocrystalline fin. As another example, the CFET may comprise an n-type (or p-type) group IV semiconductor monocrystalline nanowire or nanosheet situated above a p-type (or n-type) group IV semiconductor monocrystalline nanowire or nanosheet.

In embodiments, the semiconductor substrate may be a group IV semiconductor substrate. For instance, it can be selected from Si, Ge, $Si_{1-z}Ge_z$ wherein $0<z<1$, Sn, $Ge_{1-w}Sn_w$ wherein $0<w<1$, $Si_iGe_{1-i-j}Sn_j$, wherein $0<i<1$ and $0<j<1$, and $0<i+j<1$. It can be selected from Si, Ge, and $Si_{1-z}Ge_z$ wherein $0<z<1$. For instance, it may be a wafer made of such a material. In embodiments, the substrate may comprise one or more fins and each of the one or more semiconductor monocrystalline nanostructures may be directly above a fin.

In embodiments, a dielectric layer may be present on the semiconductor substrate. In particular, the dielectric layer may at least overlap with the vertical projection of the source and drain structures on the substrate. Before growth of the source and drain structures, the presence of the dielectric layer on the substrate and below where the source and drain structures will be grown prevents epitaxial growth from the substrate. Although epitaxial growth from the substrate can be tolerated since it would not impact the strain obtained in the semiconductor monocrystalline nanostructure, it is also not necessary.

In embodiments, the dielectric layer on the semiconductor substrate may be an oxide of the semiconductor monocrystalline material forming the substrate.

The dielectric layer typically extends laterally beyond the extremities of the semiconductor monocrystalline nanostructures. The presence of the dielectric layer beyond these extremities assures that the source and drain, during their formation, are not epitaxially grown from the surface of the substrate but well from a surface of the first extremity and second extremity, respectively.

In embodiments, the thickness (i.e. the height) of the dielectric layer may be from 1 to 50 nm, and in some examples from 5 to 50 nm, from 10 to 50 nm, or from 15 to 35 nm.

The one or more semiconductor monocrystalline nanostructures are not limited in numbers.

In embodiments, the one or more semiconductor monocrystalline nanostructures may comprise a first and a second adjacent, co-planar, and separated semiconductor monocrystalline nanostructure, wherein neither the drain structure nor the source structure of the first nanostructure touches either the drain structure or the source structure of the second semiconductor monocrystalline nanostructure. This is desirable because by avoiding epitaxial merging, typical defects associated therewith are avoided.

In any embodiment, each of the group IV semiconductor monocrystalline nanostructures can be made of a material selected from Si, $Si_{1-y}Ge_y$, and Ge, wherein $0<y<1$.

In embodiments, at least one of the one or more semiconductor monocrystalline nanostructures is selected from nanowires and nanosheets.

In embodiments, wherein at least one of the one or more semiconductor monocrystalline nanostructures is selected from nanowires and nanosheets, the semiconductor structure may be a complementary field-effect transistor. In such embodiments, the substrate typically comprises one or more fins and each of the one or more semiconductor monocrystalline nanostructures is positioned directly above a fin.

In embodiments, the length of each semiconductor monocrystalline nanostructure may be from 5 nm to 200 nm, and in some examples from 10 to 100 nm.

In some examples, the length of each semiconductor monocrystalline nanostructure corresponds to the distance between their first and their second extremity. The effect of the present disclosure is strongest with a shorter distance between the extremities because the induced strain is more important at the extremities than at mid-distance between the extremities.

In embodiments, the height of each semiconductor monocrystalline nanostructure may be from 3 nm to 200 nm, and in some examples from 5 nm to 200 nm, 10 nm to 60 nm, or 15 to 50 nm.

In embodiments, the width of each semiconductor monocrystalline nanostructure may be from 3 to 200 nm.

In embodiments, the semiconductor monocrystalline nanostructures may have a ratio length on height of from of from 1 to 10, and in some examples from 2 to 10, or from 2 to 4.

Typically, each semiconductor monocrystalline nanostructure will comprise a channel of a field-effect transistor. In contact with that channel and covering it (e.g. entirely), a gate structure and dielectric spacers will typically be present. The dielectric spacers are desirable as they prevent epitaxial growth away from the extremities of the semiconductor monocrystalline nanostructure.

In embodiments, the non-zero distance separating the top surface of the semiconductor substrate from the semiconductor monocrystalline nanostructures may be from 5 to 50 nm, and in some examples from 10 to 50 nm or from 15 to 35 nm.

In embodiments where the substrate comprises one or more fins and each of the one or more semiconductor monocrystalline nanostructures is directly above one fin, the non-zero distance may be the distance between the top of the fin and the bottom of the semiconductor monocrystalline nanostructure.

The source structure and the drain structure are epitaxially grown on the first extremity and the second extremity, respectively.

As a result of them being epitaxially grown on their respective extremity, a surface of the source/drain structure in contact with a surface of the first/second extremity has a crystal lattice structure matching the crystal lattice structure of the surface of the first/second extremity.

In embodiments, the doped group IV semiconductor of which the epitaxial source and drain structures are made is the same group IV semiconductor than the one of which the group IV semiconductor monocrystalline nanostructures are made. For instance, they can both be Si or both be Ge or both be $Si_xGe_{1-x}$ with a same proportion of Ge.

In an embodiment, the source and drain structures are made of a monocrystalline n-doped semiconductor monocrystalline material having a larger unstrained lattice constant than the unstrained lattice constant of the semiconductor monocrystalline material making the semiconductor monocrystalline nanostructure on which they are present, thereby creating tensile strain in that semiconductor monocrystalline nanostructure.

For instance, the group IV semiconductor of the source and drain structures may comprise:

$Si_{1-x}Ge_x$ when the semiconductor monocrystalline nanostructure on which they are grown comprises $Si_{1-y}Ge_y$ wherein $x>y\geq 0$, or $Ge_{1-w}Sn_w$ wherein $0<w<0.1$, when the semiconductor monocrystalline nanostructure on which they are grown are made of Ge or $Si_{1-y}Ge_y$ with $0\leq y\leq 1$, or $Si_iGe_{1-i-j}Sn_j$, wherein $0<i<j<1$, and $0<i+j<1$ when the semiconductor monocrystalline nanostructure on which they are grown are made of Ge.

In embodiments, the group IV semiconductor of the source and drain structures may comprise:

$Si_{1-x}Ge_x$ when the semiconductor monocrystalline nanostructure on which they are grown comprises $Si_{-y}Ge_y$, wherein x>y≥0, or $Ge_{1-w}Sn_w$ wherein 0<w<0.1 when the semiconductor monocrystalline nanostructure on which they are grown are made of Ge or $Si_{1-y}Ge_y$ with 0≤y<1, or $Si_iGe_{1-i-j}Sn_j$, wherein 0<i<1, 0<j<1, and 0<i+j<1, wherein i and j are chosen in such a way that the lattice constant of $Si_iGe_{1-i-j}Sn_j$ is larger than the lattice constant of Ge, when the semiconductor monocrystalline nanostructure on which they are grown are made of Ge.

In embodiments, the group IV semiconductor of the source and drain structures may comprise $Si_{1-x}Ge_x$ while the semiconductor monocrystalline nanostructure on which they are grown comprise Si wherein 0.70≥x>0, for instance 0.70≥x≥0.2, or 0.70≥x≥0.40.

In embodiments, the source and drain structures may each display a surface, other than the interface with the extremity of nanostructure on which they are grown, which is parallel to the surface forming that extremity.

In embodiments, the source and drain structures may each display two intersecting planes of the family {111} forming an angle, wherein the angle of the source structure points away from the angle of the drain structure.

In embodiments, the source and drain structures may be made of a group IV semiconductor doped with one or more of Sb and Bi, and one or more of As and P. This is desirable because the presence of As and/or P helps achieving a larger doping concentration than would be possible in their absence.

In embodiments, [Sb]+[Bi]>[As]+[P]. This obtains tensile strain. And, in some examples ([Sb]+[Bi])>1.1([As]+[P]).

In embodiments, [Sb]+[Bi]>1020 $cm^{-3}$, and in some examples [Sb]+[Bi]>2*1020 $cm^{-3}$.

In embodiments, [As]+[P]>1020 $cm^{-3}$, and in some examples [As]+[P]>2*1020 $cm^{-3}$.

In any embodiment, the dopant concentration in the group IV semiconductor of the source and drain structures may be at least $10^{20}$ $cm^{-3}$, and in some examples above $2*10^{20}$ $cm^{-3}$.

When tensile strain is created in the semiconductor monocrystalline nanostructure, this tensile strain is at least present in the longitudinal direction of the semiconductor monocrystalline nanostructure (i.e. along the length thereof). In embodiments, the tensile strain is also present in the direction perpendicular to the substrate. In embodiments, the tensile strain is also present in the direction parallel to the substrate but perpendicular to the length of the semiconductor monocrystalline nanostructure. Typically, the tensile strain is present in all three directions.

In a second aspect, the present disclosure relates to a method for forming a semiconductor structure according to any embodiment of the first aspect, comprising:
a. Providing a semiconductor substrate having a top surface,
b. Providing one or more semiconductor monocrystalline nanostructures, each having a first and a second extremity defining an axis parallel to the top surface of the semiconductor substrate and separated therefrom by a non-zero distance,
c. Growing epitaxially on each semiconductor monocrystalline nanostructures a source structure on the first extremity, and a drain structure on the second extremity, wherein the epitaxial source and drain structures are made of a group IV semiconductor doped with one or more of Sb and Bi, and optionally one or more of As and P, thereby creating tensile strain in the group IV semiconductor monocrystalline nanostructure.

Any feature of the second aspect may be as correspondingly described in any embodiment of the first aspect. In particular, the semiconductor structure, the assembly, the semiconductor substrate, the dielectric layer, the one or more semiconductor monocrystalline nanostructures, their extremities, the non-zero distance, the source structure, and the drain structure may be as correspondingly described in the first aspect of the present disclosure.

In a third aspect, the present disclosure relates to the use of epitaxially grown source and drain structures made of a first group IV semiconductor material doped with one or more of Sb and Bi, and optionally one or more of As and P, to induce tensile strain in a semiconductor monocrystalline nanostructure made of a second group IV semiconductor monocrystalline material which can be the same or which can be different from the first group IV semiconductor material.

Any feature of the third aspect may be as correspondingly described in any embodiment of the first or second aspect. In particular, the source and drain structures, their epitaxial growth, the first group IV semiconductor monocrystalline material making them, their doping, the semiconductor monocrystalline nanostructure, and the second group IV semiconductor monocrystalline material may be as correspondingly described in any embodiment of the first and second aspect of the present disclosure.

We now refer to FIG. 1 where three examples of semiconductor structures (1) are shown, each comprising:
a. An assembly (2) formed by a semiconductor substrate (3) having an optional dielectric layer (4) thereon, the semiconductor substrate (3) having a top surface (8),
b. One or more group IV semiconductor monocrystalline nanostructures (5), each having a first and a second (7) extremity defining an axis parallel to the top surface (8) of the semiconductor substrate (3) and separated therefrom by a non-zero distance (d), each nanostructure (5) having a source structure epitaxially grown on the first extremity (not depicted) and a drain (10) structure epitaxially grown on the second (7) extremity,
wherein the source and drain (10) structures are made of a group IV semiconductor doped with one or more of Sb and Bi, and optionally one or more of As and P, thereby creating tensile strain (11) in the group IV semiconductor monocrystalline nanostructure (5).

In this FIGURE, these three semiconductor structures (1) differ in the length of the semiconductor monocrystalline nanostructure (5) they comprise.

In FIG. 1, the strain is measured in the longitudinal direction X.

In FIG. 1, the right back quarter of three different silicon monocrystalline nanostructures (5), differing in length, are depicted. In other words, the right half is depicted, the back half is depicted, the left half is not depicted, and the front half is not depicted. In each FIGURE, the nanostructure (5) on the left has a length of 28 nm, the nanostructure (5) in the middle has a length of 50 nm, and the nanostructure (5) on the right has a length of 100 nm. In each FIGURE, the nanostructure (5) on the left has a width of 14 nm, the nanostructure (5) in the middle has a width of 24 nm, and the nanostructure (5) on the right has a width of 28 nm.

Dimensions are given for illustration purposes. The substrate is in each case a silicon wafer and the dielectric layer (4) is SiO2.

Only the back half of the drain (10), not its front half, is depicted. The drain (10) is in the case of FIG. 1 made of Si doped with one or more of Sb and Bi, and optionally one or more of As and P.

Visible in each of these FIGURES are the two intersecting planes (13, 13') of the family {111} forming an angle.

Also visible from these FIGURES is the fact that the drain (10) is grown from the nanostructure (5), not from the substrate. The presence of the optional dielectric layer (4) beyond the extremities assures that the source and drain (10), during their formation, are not epitaxially grown from the surface of the substrate but well from a surface of the first extremity and second (7) extremity.

The black spot shown in the nanostructure (5) represents expected tensile stress.

The black spot shown in the drain (10) represents expected compressive stress.

As can be seen in FIG. 1, longitudinal (X) tensile stress is mostly expected at the extremity (7) and would tend to decrease toward the center of the nanostructure (5).

Decreasing tensile stress values toward the center of the nanostructure (5) (not depicted in the FIGURE) are expected.

It is also expected that the extent of the device's width has little or no influence on the obtained stress.

Also expected is that the strain close to the source or drain (10) can reach 1% while the strain in the middle of the source-drain axis would be lower than 0.1% for the longest 100 nm nanostructure (5).

It is to be understood that although embodiments, specific constructions, and configurations, as well as materials, have been discussed herein for devices according to the present disclosure, various changes or modifications in form and detail may be made without departing from the scope of this disclosure. Steps may be added or deleted to methods described within the scope of the present disclosure.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A semiconductor structure comprising:
a semiconductor substrate having a top surface;
a dielectric layer formed on the semiconductor substrate; and
one or more group IV semiconductor monocrystalline nanostructures, each having a first extremity and a second extremity defining an axis parallel to the top surface of the semiconductor substrate and separated therefrom by the dielectric layer having a non-zero distance, each nanostructure of the one or more group IV semiconductor monocrystalline nanostructures having a source structure epitaxially grown on the first extremity and a drain structure epitaxially grown on the second extremity,
wherein the dielectric layer extends laterally beyond the first extremity and the second extremity along the axis parallel to the top surface;
wherein the group IV semiconductor of the source and drain structures include $Si_{1-x}Ge_x$ when the semiconductor monocrystalline nanostructure on which they are grown comprises $Si_{1-y}Ge_y$ wherein x>y≥0; and
wherein the source and drain structures are made of a group IV semiconductor doped with Sb, and optionally Bi and one or more of As and P, thereby creating tensile strain in the group IV semiconductor monocrystalline nanostructure.

2. The semiconductor structure according to claim 1 wherein the epitaxial source and drain structures are made of a group IV semiconductor doped with one or more of Sb and Bi, and one or more of As and P.

3. The semiconductor structure according to claim 1, wherein the doped group IV semiconductor of which the epitaxial source and drain structures are made is the same group IV semiconductor than the one of which the group IV semiconductor monocrystalline nanostructures are made.

4. The semiconductor structure according to claim 1, wherein the group IV semiconductor of the source and drain structures comprise:
$Ge_{1-w}Sn_w$ wherein 0<w<0.1 when the semiconductor monocrystalline nanostructure on which they are grown are made of Ge or $Si_{1-y}Ge_y$ with 0≤y≤1.

5. The semiconductor structure according to claim 1, wherein the group IV semiconductor of the source and drain structures comprise:
$Si_iGe_{1-i-j}Sn_j$, wherein 0<i<j<1, and 0<i+j<1 when the semiconductor monocrystalline nanostructure on which they are grown are made of Ge.

6. The semiconductor structure according to claim 1, wherein the group IV semiconductor of the source and drain structures comprises $Si_{1-x}Ge_x$ while the semiconductor monocrystalline nanostructure on which they are grown comprise Si wherein 0.70>x>0.

7. The semiconductor structure according to claim 1, wherein the dopant concentration in the group IV semiconductor of the source and drain structures is at least $10^{20}$ cm$^{-3}$.

8. The semiconductor structure according to claim 1, wherein at least one of the one or more semiconductor monocrystalline nanostructures is selected from nanowires and nanosheets.

9. The semiconductor structure according to claim 4, wherein the semiconductor structure is a complementary field-effect transistor.

10. The semiconductor structure according to claim 1, comprising a first semiconductor monocrystalline nanostructure and a second semiconductor monocrystalline nanostructure, wherein the first semiconductor monocrystalline nanostructure and the second semiconductor monocrystalline nanostructure are adjacent, co-planar, and separated.

11. The semiconductor structure according to claim 10, wherein neither the drain structure nor the source structure of the first nanostructure touches either the drain structure or the source structure of the second semiconductor monocrystalline nanostructure.

12. The semiconductor structure according to claim 1, wherein the source and drain structures each display two intersecting planes of the family forming an angle, wherein the angle of the source structure points away from the angle of the drain structure.

13. The semiconductor structure according to claim 1, wherein the semiconductor monocrystalline nanostructures have a height of from 10 to 60 nm.

14. The semiconductor structure according to claim 1, wherein the semiconductor monocrystalline nanostructures have a length from 10 to 200 nm.

15. The semiconductor structure according to claim 1, wherein the semiconductor monocrystalline nanostructures have a length from 40 to 100 nm.

16. The semiconductor structure according to claim 1, wherein the semiconductor monocrystalline nanostructures have a ratio length on height of from 1 to 10.

17. The semiconductor structure according to claim 1, wherein the semiconductor monocrystalline nanostructures have a ratio length on height of from 2 to 4.

18. A method for forming a semiconductor structure according to claim 1, comprising:
   providing a semiconductor substrate having a top surface;
   providing a dielectric layer formed on the semiconductor substrate; and
   providing one or more semiconductor monocrystalline nanostructures, each having a first and a second extremity defining an axis parallel to the top surface of the semiconductor substrate and separated therefrom by the dielectric layer having a non-zero distance, wherein the dielectric layer extends laterally beyond the first extremity and the second extremity along the axis parallel to the top surface; and
   growing epitaxially on each semiconductor monocrystalline nanostructures a source structure on the first extremity, and a drain structure on the second extremity,
   wherein the epitaxial source and drain structures are made of a group IV semiconductor doped with Sb, and optionally Bi and one or more of As and P, thereby creating tensile strain in the group IV semiconductor monocrystalline nanostructure.

* * * * *